US012796054B2

(12) United States Patent
Xie et al.

(10) Patent No.: US 12,796,054 B2
(45) Date of Patent: Nov. 10, 2026

(54) CROSS CELL LOCAL INTERCONNECT WITH BPR AND CBoA

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Kangguo Cheng, Schenectady, NY (US); Su Chen Fan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 943 days.

(21) Appl. No.: 17/537,638

(22) Filed: Nov. 30, 2021

(65) Prior Publication Data

US 2023/0170395 A1 Jun. 1, 2023

(51) Int. Cl.

*H10D 64/23* (2025.01)
*H10D 30/62* (2025.01)
*H10W 20/00* (2026.01)
*H10W 20/20* (2026.01)
*H10W 20/41* (2026.01)

(Continued)

(52) U.S. Cl.

CPC ....... *H10D 64/254* (2025.01); *H10D 30/6219* (2025.01); *H10W 20/069* (2026.01); *H10W 20/0698* (2026.01); *H10W 20/20* (2026.01); *H10W 20/427* (2026.01); *H10D 30/6735* (2025.01); *H10D 30/6757* (2025.01); *H10D 62/118* (2025.01)

(58) Field of Classification Search

CPC .............. H10D 30/6219; H10D 64/254; H01L 21/76895; H01L 21/76897; H01L 23/535; H01L 23/5286; H10W 20/432; H10W 20/435; H10W 20/481

See application file for complete search history.

(56) References Cited

U.S. PATENT DOCUMENTS 7,002,187 B1 2/2006 Husher
9,570,395 B1 2/2017 Sengupta et al.

(Continued)

FOREIGN PATENT DOCUMENTS

JP H0521474 A 1/1993
JP 2024-542538 A 11/2024

OTHER PUBLICATIONS

International Search Report from PCT/EP2022/080311 dated Mar. 3, 2023. (10 pages).

(Continued)

*Primary Examiner* — Joseph C. Nicely
(74) *Attorney, Agent, or Firm* — Harrity & Harrity, LLP

(57) ABSTRACT

A semiconductor device is presented that includes source/drain epitaxial regions disposed over a substrate, source/drain contacts (CA) disposed in direct contact with the source/drain epitaxial regions, where at least one of the CA contacts directly contacts a buried power rail or backside power rail through a via-to-BPR (VBPR) contact, a dielectric cap disposed over one or more of the CA contacts, and a local interconnect constructed in direct contact with one area of the dielectric cap such that a portion of the local interconnect is vertically aligned with the backside power rail. A backside power distribution network (BSPDN) is disposed adjacent the backside power rail.

20 Claims, 11 Drawing Sheets

(51) Int. Cl.
*H10D 30/67* (2025.01)
*H10D 62/10* (2025.01)

(56) References Cited

U.S. PATENT DOCUMENTS

| | | | | |
|---|---|---|---|---|
| 10,586,765 | B2 * | 3/2020 | Smith | H10D 30/62 |
| 10,636,739 | B2 * | 4/2020 | Beyne | H10D 84/0186 |
| 10,700,207 | B2 | 6/2020 | Chen et al. | |
| 10,777,637 | B2 | 9/2020 | Yu et al. | |
| 10,957,575 | B2 | 3/2021 | Yakimets et al. | |
| 11,094,594 | B2 | 8/2021 | Tsao | |
| 12,230,571 | B2 * | 2/2025 | Son | H10W 20/023 |
| 2012/0119307 | A1 * | 5/2012 | Li | H10D 64/01 438/586 |
| 2019/0067290 | A1 * | 2/2019 | Wang | H10B 12/31 |
| 2019/0304902 | A1 * | 10/2019 | Subramanian | H10D 30/6219 |
| 2020/0098681 | A1 * | 3/2020 | Kim | H10D 30/6219 |
| 2020/0105603 | A1 * | 4/2020 | Chang | H10D 30/024 |
| 2020/0105671 | A1 * | 4/2020 | Lai | G06F 30/39 |
| 2020/0134128 | A1 * | 4/2020 | Peng | G06F 30/392 |
| 2020/0135578 | A1 * | 4/2020 | Ching | H10D 30/024 |
| 2020/0135634 | A1 * | 4/2020 | Chiang | H10B 12/0335 |
| 2020/0135646 | A1 * | 4/2020 | Rubin | H10D 84/0149 |
| 2020/0135724 | A1 * | 4/2020 | Lin | H10D 30/0243 |
| 2020/0365509 | A1 * | 11/2020 | Sasaki | H10W 20/023 |
| 2021/0028112 | A1 * | 1/2021 | Kim | H10D 30/024 |
| 2021/0098338 | A1 * | 4/2021 | Liaw | H10D 30/014 |
| 2021/0118798 | A1 | 4/2021 | Liebmann et al. | |
| 2021/0233834 | A1 | 7/2021 | Chen et al. | |
| 2021/0305381 | A1 * | 9/2021 | Chiang | H10D 30/014 |
| 2022/0020691 | A1 * | 1/2022 | You | H10D 30/6211 |
| 2022/0037236 | A1 * | 2/2022 | Seo | H10W 20/023 |
| 2022/0157723 | A1 * | 5/2022 | Park | H10D 84/038 |
| 2022/0208757 | A1 * | 6/2022 | Do | H10D 89/10 |
| 2022/0223523 | A1 * | 7/2022 | Lee | H10D 30/6735 |
| 2022/0367490 | A1 * | 11/2022 | Chang | G11C 17/16 |
| 2022/0384589 | A1 * | 12/2022 | Su | H10D 30/014 |
| 2023/0036597 | A1 * | 2/2023 | Smith | H10D 30/014 |
| 2023/0086033 | A1 * | 3/2023 | Xie | H10D 30/014 257/401 |
| 2023/0130088 | A1 * | 4/2023 | Xie | H10D 30/014 257/288 |

OTHER PUBLICATIONS

Gupta et al., "Buried Power Rail Integration with Si FinFETs for CMOS Scaling beyond the 5 nm Node", In2020 IEEE Symposium on VLSI Technology Jun. 16, 2020 (pp. 1-2). IEEE.
Japan Patent Office, "Notice of Reasons for Refusal" Jan. 27, 2026, 09 Pages, JP Application No. 2024-531077.

* cited by examiner

CROSS CELL LOCAL INTERCONNECT WITH BPR AND CBoA

BACKGROUND

The present invention relates generally to semiconductor devices, and more specifically, to a cross cell local interconnect with buried power rail or backside power rail (BPR) and gate contact (CB) over an active region (CBoA).

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node.

With the increased demands for miniaturization, higher speed, greater bandwidth, lower power consumption, and lower latency, chip layout has become more complicated and difficult to achieve in the production of semiconductor dies. For example, the routing area has decreased.

SUMMARY

In accordance with an embodiment, a semiconductor device is provided. The semiconductor device includes source/drain epitaxial regions disposed over a substrate, source/drain contacts (CA) disposed in direct contact with the source/drain epitaxial regions, where at least one of the CA contacts directly contacts a buried power rail through a via-to-BPR (VBPR) contact, a dielectric cap disposed over one or more of the CA contacts, and a local interconnect constructed in direct contact with one area of the dielectric cap such that a portion of the local interconnect is vertically aligned with the buried power rail.

In accordance with another embodiment, a semiconductor device is provided. The semiconductor device includes source/drain epitaxial regions disposed over a substrate, source/drain contacts (CA) disposed in direct contact with the source/drain epitaxial regions, where at least one of the CA contacts directly contacts a backside power rail through a via-to-BPR (VBPR) contact, a dielectric cap disposed over one or more of the CA contacts, a local interconnect constructed in direct contact with one area of the dielectric cap such that a portion of the local interconnect is vertically aligned with the backside power rail, and a backside power distribution network (BSPDN) disposed adjacent the backside power rail.

In accordance with yet another embodiment, a method is provided for forming a semiconductor device. The method includes forming source/drain epitaxial regions over a substrate, forming source/drain contacts (CA) in direct contact with the source/drain epitaxial regions, wherein at least one of the CA contacts directly contacts a buried power rail or a backside power rail through a via-to-BPR (VBPR) contact, recessing the CA contacts to form openings, depositing a dielectric cap within the openings, constructing a local interconnect in direct contact with one area of the dielectric cap, and forming a via in direct contact with the local interconnect.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
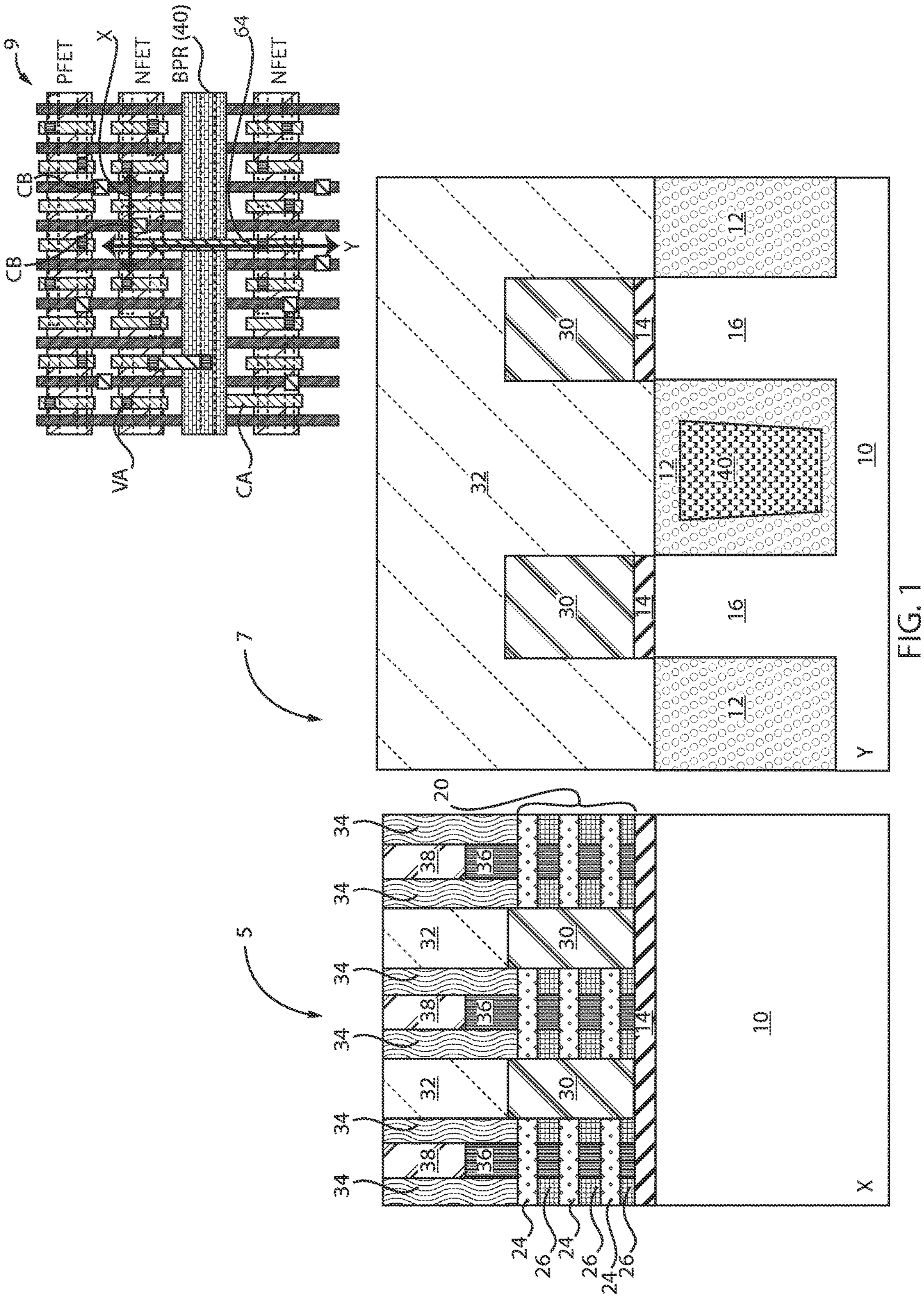
FIG. 1 is a cross-sectional view of a semiconductor structure where source/drain epitaxial formation takes place adjacent a nanosheet structure, in accordance with an embodiment of the present invention.

Embodiments in accordance with the present invention provide methods and devices for wiring a source/drain (S/D) contact from one cell to another cell through a local interconnect formed over a recessed S/D contact that wires to a buried power rail or backside power rail (BPR) to achieve pin access at cell boundary or across cell boundary.

Fin-based active devices, primarily transistors, are extensively applied for the production of standard cells and other active device configurations processed in the front end of line (FEOL) part of the integrated circuit fabrication process, and include finFETs, as well as more recent devices based on nano-wires or nano-sheets. An example technology involves the use of buried interconnect rails in the FEOL or backside power rails at backside of the wafer. BPRs can directly connect the transistors in the FEOL to a power delivery network located entirely on the back side of an integrated circuit chip. In particular, the source or drain area of a number of transistors are directly connected to a BPR. The current practice for realizing this configuration is to produce an interconnect via to the BPR, and to couple the interconnect via to the source or drain area through a local interconnect that is part of the middle of line (MOL) metallization level of the chip, which is a transition between the active devices in the FEOL, and the interconnect levels (M1, M2 etc.) in the back end of line (BEOL).

Some implementations of this approach have a number of drawbacks. Although the S/D of a FEOL device is wired to a BPR, the BEOL signal wires above the S/D are still not freed for other routing purposes.

Embodiments in accordance with the present provide a method and structure of wiring S/D contacts from one cell to another cell through local interconnects over recessed S/D contacts that wire or connect to a BPR to achieve pin access at cell boundary or across cell boundary. In other words, local interconnects are formed over recessed contacts that wire to the BPR. The exemplary structure includes at least a first S/D contact with a higher surface, at least another S/D contact with a dielectric cap, and a local interconnect attaching to the higher surface that also partially lands on the dielectric cap. The method includes forming a S/D contact with at least one contact connecting to the BPR, recessing the contact, forming a contact dielectric cap, forming a local interconnect which has one side landing over the contact dielectric cap and the other side connecting to another S/D contact, and wiring the local interconnect to BEOL.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure where source/drain epitaxial formation takes place adjacent a nanosheet structure, in accordance with an embodiment of the present invention.

Methods of forming integrated circuit (IC) structures have been developed that enable the formation of a field effect transistor (FET) with a gate contact (CB) over an active region (CBoA) to allow for area scaling. More specifically, middle of line (MOL) contacts are contacts that connect FETs to the back end of line (BEOL) metal levels. These MOL contacts include at least one gate contact and source/drain contacts (CAs). The gate contact extends vertically through the interlayer dielectric (ILD) material from a metal wire or via in the first BEOL metal level (referred to as the $M_1$ level) to the gate of the FET. Each source/drain contact extends vertically through the ILD material from a metal wire or via in the first BEOL metal level to a metal plug (TS), which is above and immediately adjacent to a source/drain region of the FET. Conventional techniques for forming these MOL contacts inherently include risks of the following, that is, shorts occurring between the gate contact and a metal plug, particularly, if the gate contact is over an active region or close thereto and shorts occurring between the source/drain contacts and the gate. However, the exemplary embodiments alleviate such issues with buried power rails or backside power rails where pins in one cell can't be accessed by another cell due to the existence of tall S/D contacts by providing a method and structure of wiring S/D contacts from one cell to another cell through local interconnects over recessed S/D contacts that wire or connect to a BPR to achieve pin access at cell boundary or across cell boundary. In other words, local interconnects are formed over recessed contacts that wire to BPR.

Referring to FIG. 1, a semiconductor structure 5 includes a semiconductor substrate 10. A dielectric layer 14 is formed over the semiconductor substrate 10. Nanosheet stacks 20 can be formed over the dielectric layer 14. Nanosheet stacks 20 can include, e.g., alternating layers of a first semiconductor material and a second semiconductor material 24. The first semiconductor material can be, e.g., silicon germanium (SiGe) and the second semiconductor material 24 can be, e.g., silicon (Si). A dummy gate (not shown) can be formed over the nanosheet stacks 20. A hardmask (not shown) can be formed over the dummy gate.

The first semiconductor material of the nanosheets stacks 20, the dummy gate, and the hardmask are replaced with a high-k metal gate (HKMG) 36 in a replacement metal gate (RMG) process. The HKMG 36 is positioned adjacent the second semiconductor material 24 of the nanosheet stacks 20. Additionally, inner spacers 26 are formed adjacent the etched first semiconductor material.

Source/drain epitaxial regions 30 can be formed adjacent opposed ends of the nanosheet stacks 20. The source/drain epitaxial regions 30 directly contact a top surface of the dielectric layer 14. The source/drain epitaxial regions 30 also directly contact the inner spacers 26, as well as the second semiconductor material 24 of the nanosheet stacks 20. The source/drain epitaxial regions 30 extend above the nanosheet stacks 20.

Figure 11:
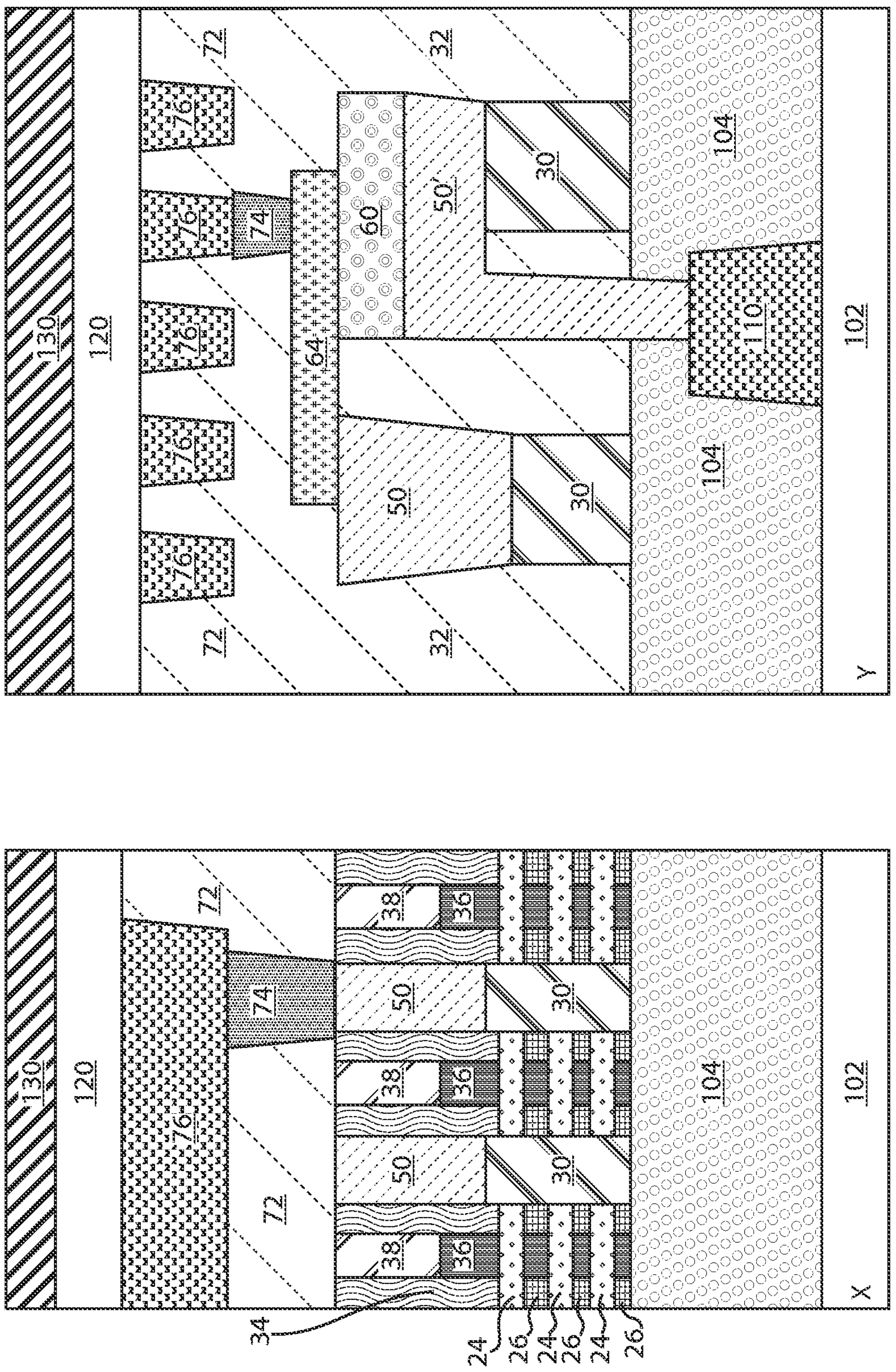
FIG. 11 is a cross-sectional view of a semiconductor structure including a backside power rail and a backside power distribution network, in accordance with another embodiment of the present invention.

An inter-layer dielectric (ILD) 32 is formed over and in direct contact with the source/drain epitaxial regions 30. Gate spacers 34 are formed over the nanosheet stacks 20 such that a gate dielectric cap 38 is positioned between gate spacers 34. The gate dielectric cap 38 directly contacts portions of the HKMG 36. The gate spacers 34 are vertically aligned with the inner spacers 26. The source/drain epitaxial regions 30 are vertically aligned with the ILD 32. The dielectric layer 14 is formed under the S/D epi and gate. A buried power rail (BPR) 40 can be formed between the active regions. In some embodiments, the buried power rail is not formed at this stage of the process, and later a backside power rail can be formed after the wafer is flipped and substrate thinning is performed (FIG. 11).

Semiconductor structure 5 is a cross-sectional view along axis X of top view 9.

Semiconductor structure 7 is a cross-sectional view along axis Y of top view 9.

Semiconductor structure 7 also illustrates shallow trench isolation (STI) regions 12 formed within the semiconductor substrate 10 defining fins 16. Additionally, the BPR 40 is formed within the semiconductor substrate 10. The BPR 40 is vertically offset from the source/drain epitaxial regions 30.

Top view 9 illustrates the CA and CB contacts, as well as the BPR 40. The top view 9 also illustrates the local interconnect 64 described below.

The semiconductor substrate 10 can be crystalline, semi-crystalline, microcrystalline, or amorphous. The semiconductor substrate 10 can be essentially (e.g., except for contaminants) a single element (e.g., silicon), primarily (e.g., with doping) of a single element, for example, silicon (Si) or germanium (Ge), or the semiconductor substrate 10 can include a compound, for example, GaAs, SiC, or SiGe. The semiconductor substrate 10 can also have multiple material layers. In some embodiments, the semiconductor substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the semiconductor substrate 10. In some embodiments, the semiconductor substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The dielectric layer 14 can include, but is not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectric layer 14 can be conformally deposited using atomic layer deposition (ALD) or, chemical vapor deposition (CVD). Variations of CVD processes suitable for forming the dielectric layer 14 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Examples of semiconductor materials that can be used in forming the nanosheet stacks 20 include at least silicon (Si), germanium (Ge), silicon germanium alloys (SiGe), silicon carbide (SiC), silicon germanium carbide (SiGeC), III-V compound semiconductors and/or II-VI compound semiconductors. One skilled in the art can contemplate a number of different semiconductor materials for forming the nanosheet stacks 20.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Source/drain epitaxial regions 30 can be of the same or different materials for p-type field effect transistor (pFET) and n-type field effect transistor (nFET) devices, and can be either in-situ doped with appropriate polarity dopants (B for pFET and P for nFET devices) or doped by ion implantation.

The ILD 32 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the ILD 32 can be a low-k oxide.

The inner spacers 26 and the gate spacers 34 can include any of one or more of SiN, SiBN, SiCN and/or SiBCN films.

As noted above, HKMGs 36 are formed in regions or openings of the device structure previously occupied by the dummy gate, the hardmask, and the first semiconductor material (e.g., SiGe). In one example, a high-k material and a work function metal can be deposited. The high-k material can be any of the materials $HfO_x$, $HfSiO_x$, $Al_2O_3$, $ZrO_2$, $ZrSiO_x$, among other materials. The work function material can include any of the following metal compounds TiN, TaN, TiC, TaC, $La_2O_3$, Al, $AlO_x$, among other materials. Both high-k and work function metals can be deposited by PVD, CVD or ALD processes.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 2:
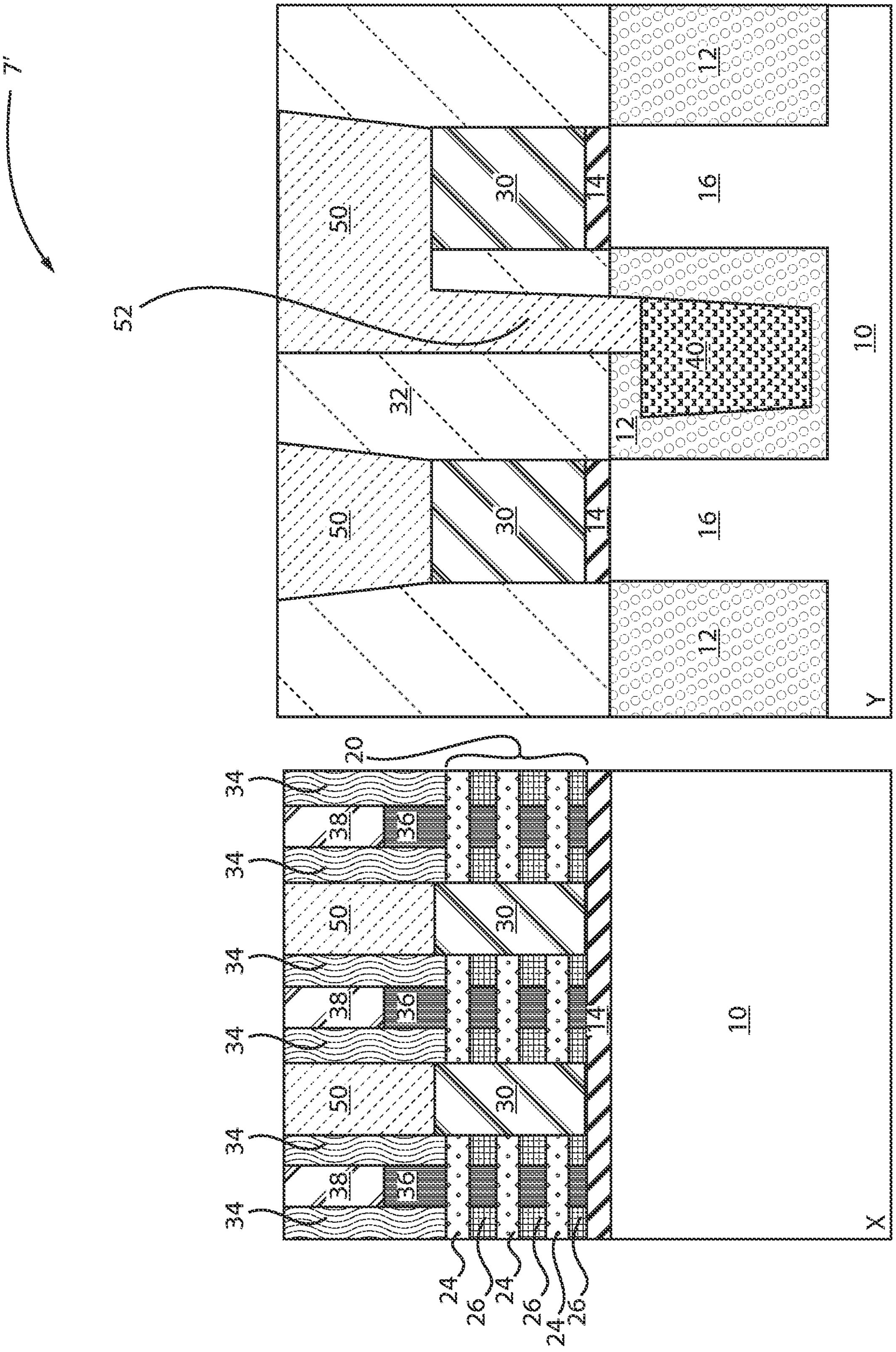
FIG. 2 is a cross-sectional view of the semiconductor structure of FIG. 1 where various types of middle-of-line (MOL) contacts are formed, in accordance with an embodiment of the present invention.

FIG. 2 is a cross-sectional view of the semiconductor structure of FIG. 1 where various types of middle-of-line (MOL) contacts are formed, in accordance with an embodiment of the present invention.

In various example embodiments, various MOL contacts include CA contacts 50 (also referred to as source/drain (S/D) contacts) and via-to-BPR (VBPR) contact 52 (also referred to as an extension region), which wires CA contact 50 to the BPR 40. CA contacts 50 are formed over and in direct contact with the source/drain epitaxial regions 30.

In structure 7', in the Y direction, one of the CA contacts 50 extends to a top surface of the BPR 40.

The CA contacts 50 and the VBPR contact 52 include metals such as a silicide liner, such as Ti, Ni, NiPt, etc., a thin metal adhesion layer, such as TiN, or TaN, and high conductive metal, such as Co, W, Ru, etc.

In various exemplary embodiments, the overburden of the metals for CA contacts 50 and VBPR contact 52 can be removed by a chemical mechanical polishing (CMP) process.

Figure 3:
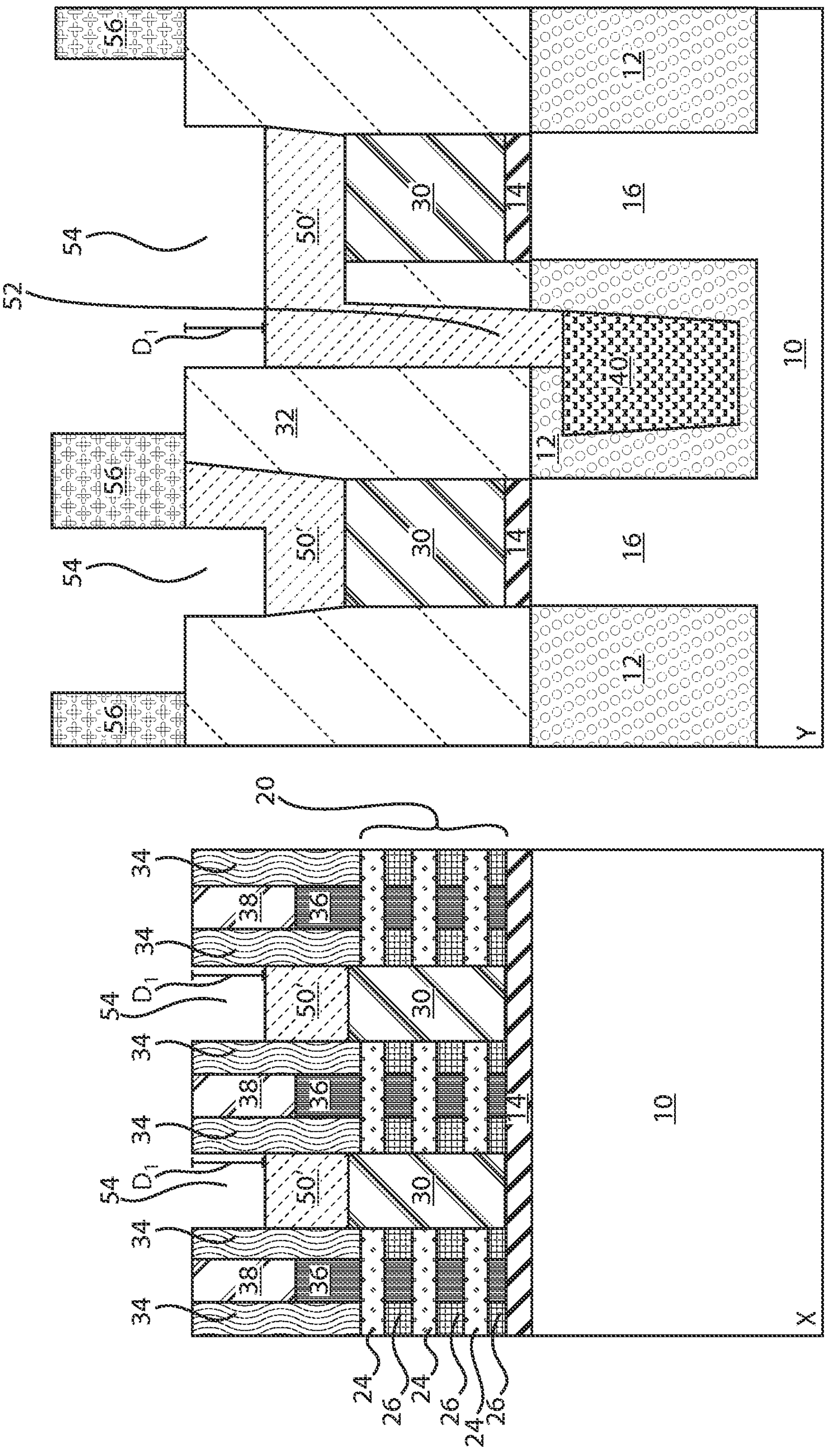
FIG. 3 is a cross-sectional view of the semiconductor structure of FIG. 2 where the conductive material from the metallization is recessed, in accordance with an embodiment of the present invention.

FIG. 3 is a cross-sectional view of the semiconductor structure of FIG. 2 where the conductive material from the metallization is recessed, in accordance with an embodiment of the present invention.

In various example embodiments, a mask layer 56 (e.g., an organic planarization layer (OPL)) is formed by conventional litho and etch process, and exposed CA contacts 50 and VBPR contact 52 are recessed.

In the X direction, the CA contact 50 is recessed by a distance Di such that remaining CA contact (or recessed CA contact) is designated as 50'. Openings 54 are formed over the recessed CA contact 50'.

In the Y direction, the CA contact 50 is also recessed by a distance Di such that remaining CA contact (or recessed CA contact) is designated as 50'. Openings 54 are formed over the recessed CA contact 50'. The presence of the mask layer 56 results in one of the recessed CA contact 50' having an irregular shape (left-hand side). In this instance, the irregular shape resembles an inverted L-shaped configuration. Thus, the VBPR contact 52 has a generally inverted L-shaped configuration.

The mask layer 56 can include an organic planarization material, which is a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the mask layer 56 forms a planar horizontal surface. Exemplary organic planarization materials include, but are not limited to, near-frictionless carbon (NFC) material, diamond-like carbon, polyarylene ether, and polyimide. The mask layer 56 can be deposited, for example, by spin coating. The thickness of the mask layer 56 can be from about 100 nm to about 500 nm, although lesser and greater thicknesses can also be employed.

Figure 4:
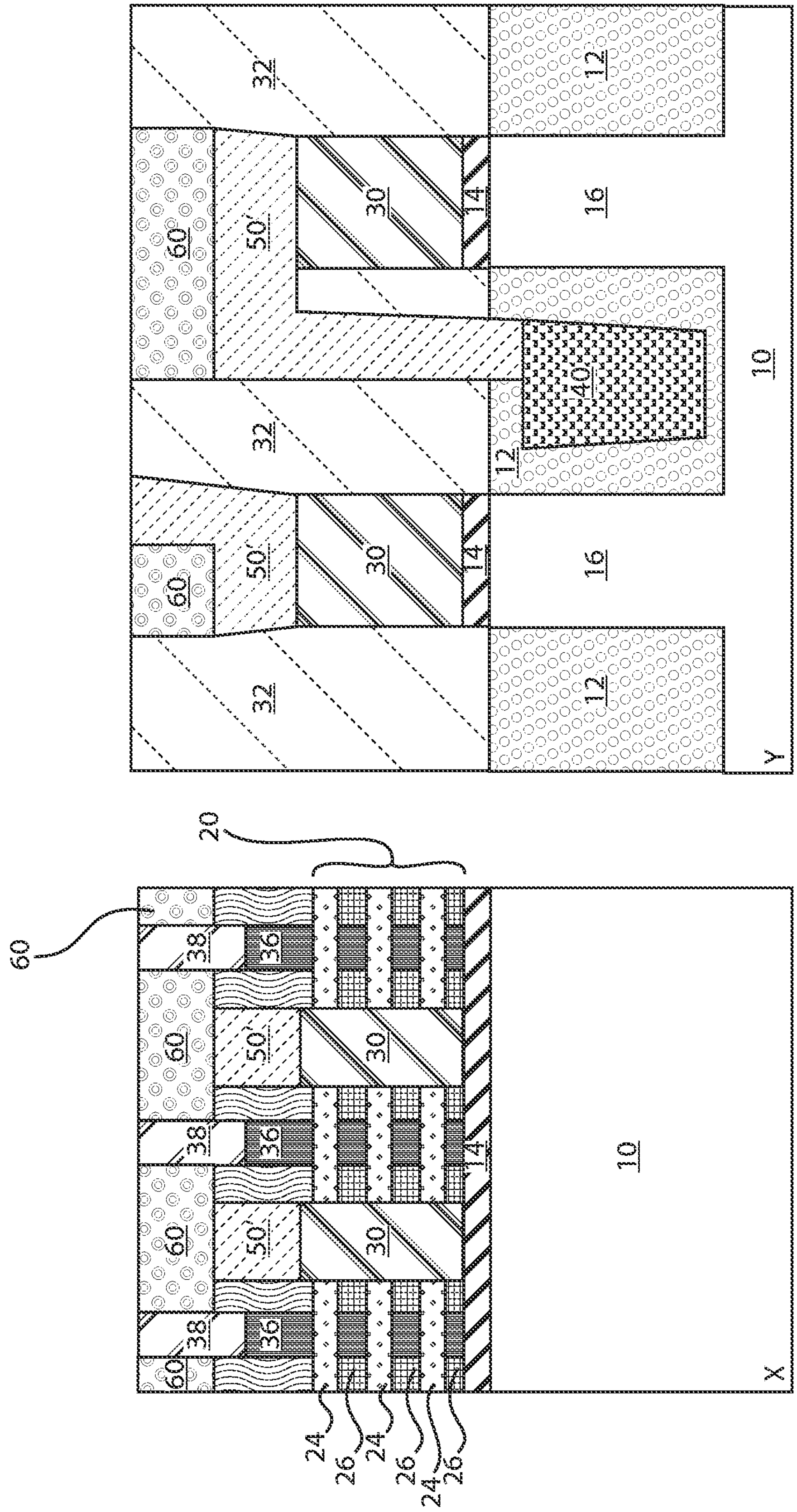
FIG. 4 is a cross-sectional view of the semiconductor structure of FIG. 3 where the exposed gate spacer is selectively removed, and a dielectric cap is deposited over the recessed conductive material, in accordance with an embodiment of the present invention.

FIG. 4 is a cross-sectional view of the semiconductor structure of FIG. 3 where the exposed gate spacer 34 is selectively removed, and a dielectric cap 60 is deposited over the recessed conductive material, in accordance with an embodiment of the present invention.

In various example embodiments, the dielectric cap 60 is deposited over the recessed CA contacts 50'. The dielectric cap 60 can also be referred to as a CA cap.

Figure 5:
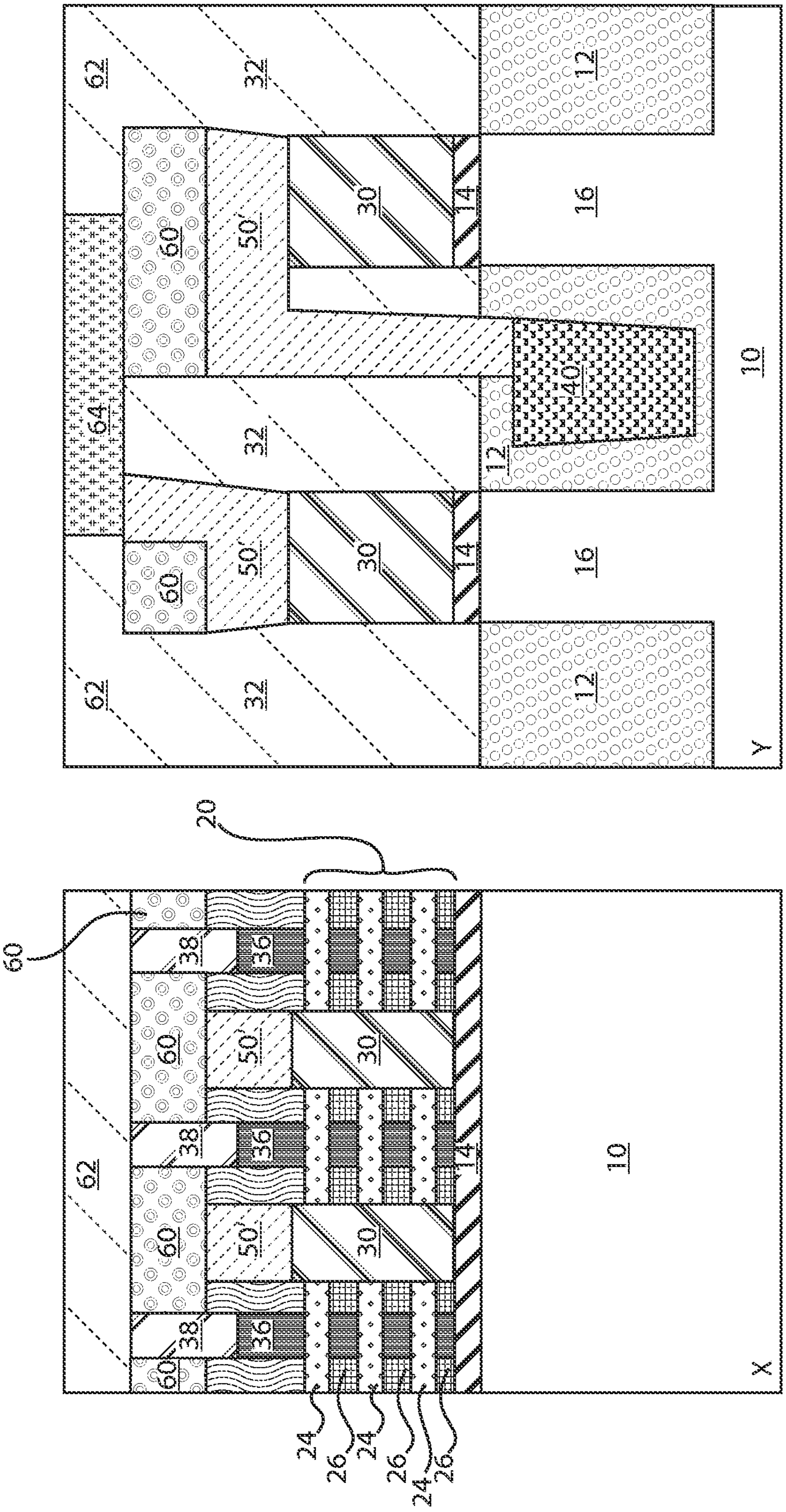
FIG. 5 is a cross-sectional view of the semiconductor structure of FIG. 4 where an interlayer dielectric (ILD) and a local interconnect are formed, in accordance with an embodiment of the present invention.

FIG. 5 is a cross-sectional view of the semiconductor structure of FIG. 4 where an interlayer dielectric (ILD) and a local interconnect are formed, in accordance with an embodiment of the present invention.

In various example embodiments, an ILD 62 and a local interconnect 64 are formed. The ILD 62 can be deposited by, e.g., PVD or CVD process. The local interconnect 64 is formed by conventional litho/etch patterning and metallization process, and is later wired to BEOL. The local interconnect 64 wires an un-recessed portion of the CA contact 50 over a fully recessed CA/VBPR contact, such that the un-recessed CA can have an opportunity to connect to BEOL wires at different cells. Thus, the local interconnect 64 is wired to the BEOL.

Figure 6:
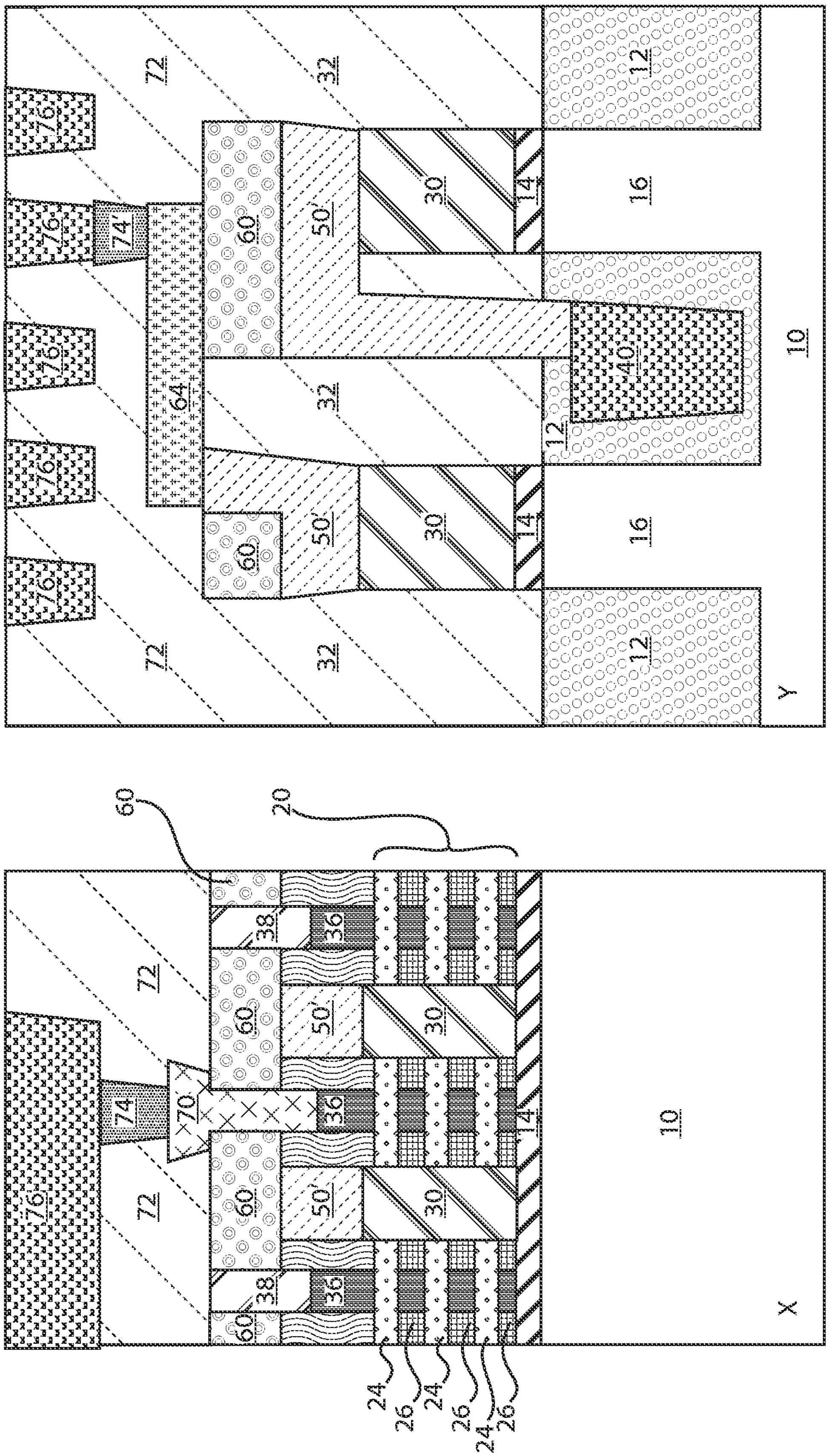
FIG. 6 is a cross-sectional view of the semiconductor structure of FIG. 5 where a BEOL via and a first BEOL metal layer are formed, in accordance with an embodiment of the present invention.

FIG. 6 is a cross-sectional view of the semiconductor structure of FIG. 5 where a BEOL via and a first BEOL metal layer are formed, in accordance with an embodiment of the present invention.

In various example embodiments, vias and a metal line (M1) layer are formed.

In the X direction, a gate CB contact 70 is formed between the dielectric cap 60. The gate CB contact 70 is disposed in direct contact with a sidewall of the dielectric cap 60. An ILD 72 is deposited over the ILD 62, gate CB contact 70 and local interconnect 64. A via 74 "VB" is formed over and in direct contact with the gate CB contact 70. A metal line (M1) layer 76 is formed over and in direct contact with the via 74.

In the Y direction, a via 74' "VA" is formed over and in direct contact with the local interconnect 64. The M1 layer 76 is formed over and in direct contact with the via 74'.

A first end of the local interconnect 64 rests on the un-recessed portion of CA contact 50 (the L-shaped CA contact) associated with a first source/drain epitaxial region and a second end of the local interconnect 64 rests on a recessed portion of CA contact 50' associated with a second source/drain epitaxial region. By doing this, the exemplary methods effectively wire the first S/D region to the M1 lines over the second S/D region, which advantageously improves the routing flexibility and availability.

ILD 72 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), low-k dielectric (k value$<$3.9) or any suitable combination of those materials. In one example, the dielectric 72 is low-k dielectric.

Non-limiting examples of suitable conductive materials for the M1 layer 76 and vias 74, 74' (VB and VA) include conventional Cu metallization processed with damascene process. Suitable conductive materials can also be metals like Co or Ru. A thin metal adhesion layer is deposited before Cu, Co or Ru fill.

Figure 7:
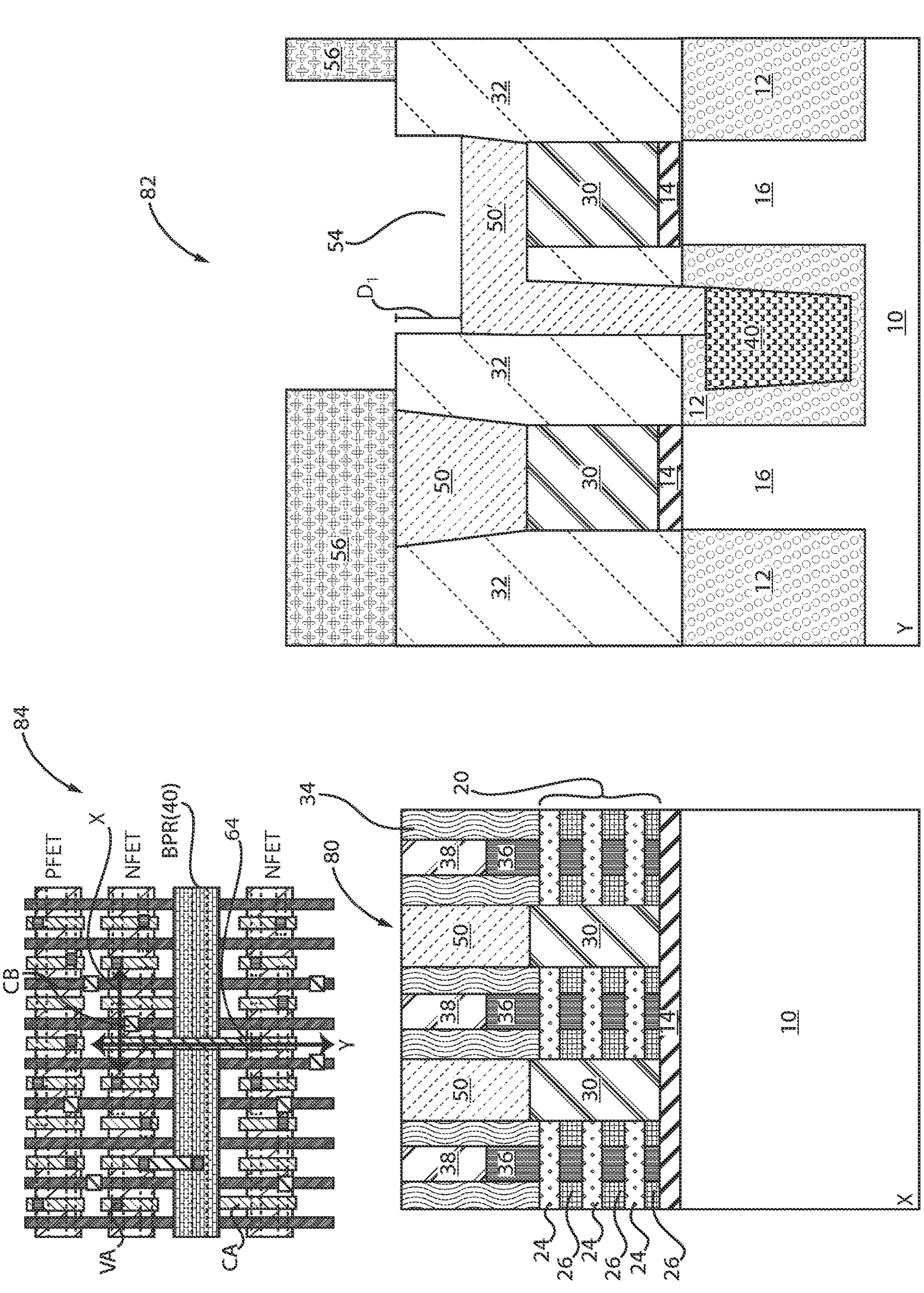
FIG. 7 is a cross-sectional view of the semiconductor structure where patterning takes place after metallization and selective recessing of the conductive material from metallization, in accordance with another embodiment of the present invention.

FIG. 7 is a cross-sectional view of the semiconductor structure where patterning takes place after metallization and selective recessing of the conductive material from metallization, in accordance with another embodiment of the present invention.

In another example embodiment, CA contacts 50 and VBPR contact 52 are formed, and some CA contacts which connect to the BPR 40 through the VBPR contact 52 are recessed while other CA contacts are protected by the mask layer 56 using conventional litho patterning process.

In the Y direction, in structure 82, the recessed CA contact 50' is recessed by a distance Di. Opening 54 is formed over the recessed CA contact 50'.

In the X direction, in structure 80, the CA contacts 50 remain intact, that is, they are not recessed. The CA contacts 50 are flush or level with the top surface of gate spacers 34 and the top surface of gate dielectric cap 38.

The top view 84 illustrates the CA contact, the CB contacts, the "VA" via, and the BPR 40. The top view 84 also illustrates the local interconnect 64.

Figure 8:
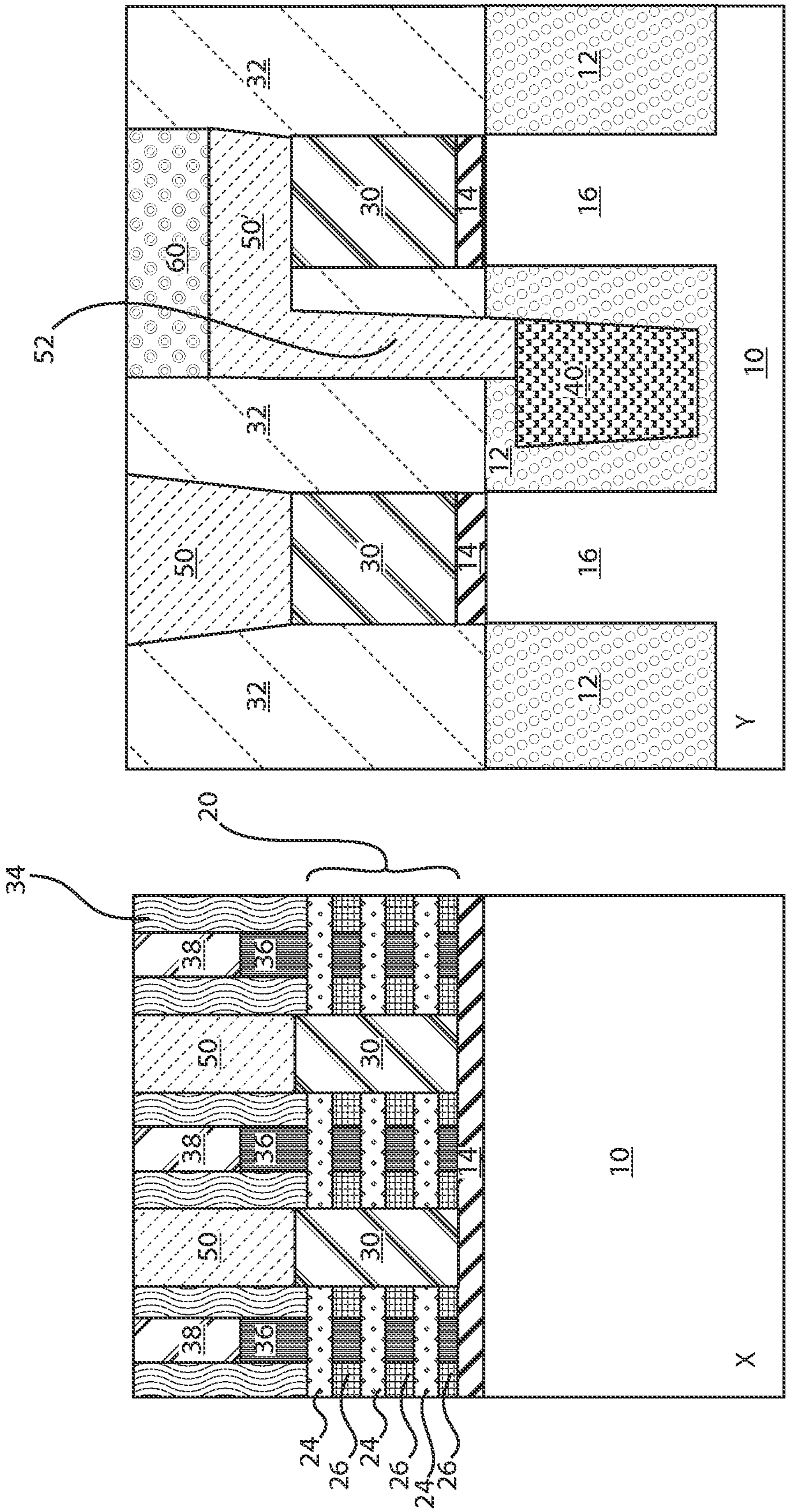
FIG. 8 is a cross-sectional view of the semiconductor structure of FIG. 7 where a dielectric cap is deposited over one or more of the conductive material regions, in accordance with an embodiment of the present invention.

FIG. 8 is a cross-sectional view of the semiconductor structure of FIG. 7 where a dielectric cap is deposited over one or more of the conductive material regions, in accordance with an embodiment of the present invention.

In various example embodiments, the dielectric cap 60 is deposited over the recessed CA/VBPR contact 50'/52. The dielectric cap 60 is vertically aligned with the VBPR contact 52 and a source/drain epitaxial region 30. The VBPR contact 52 directly contacts the top surface of the BPR 40.

In the X direction, there is no dielectric cap 60.

Figure 9:
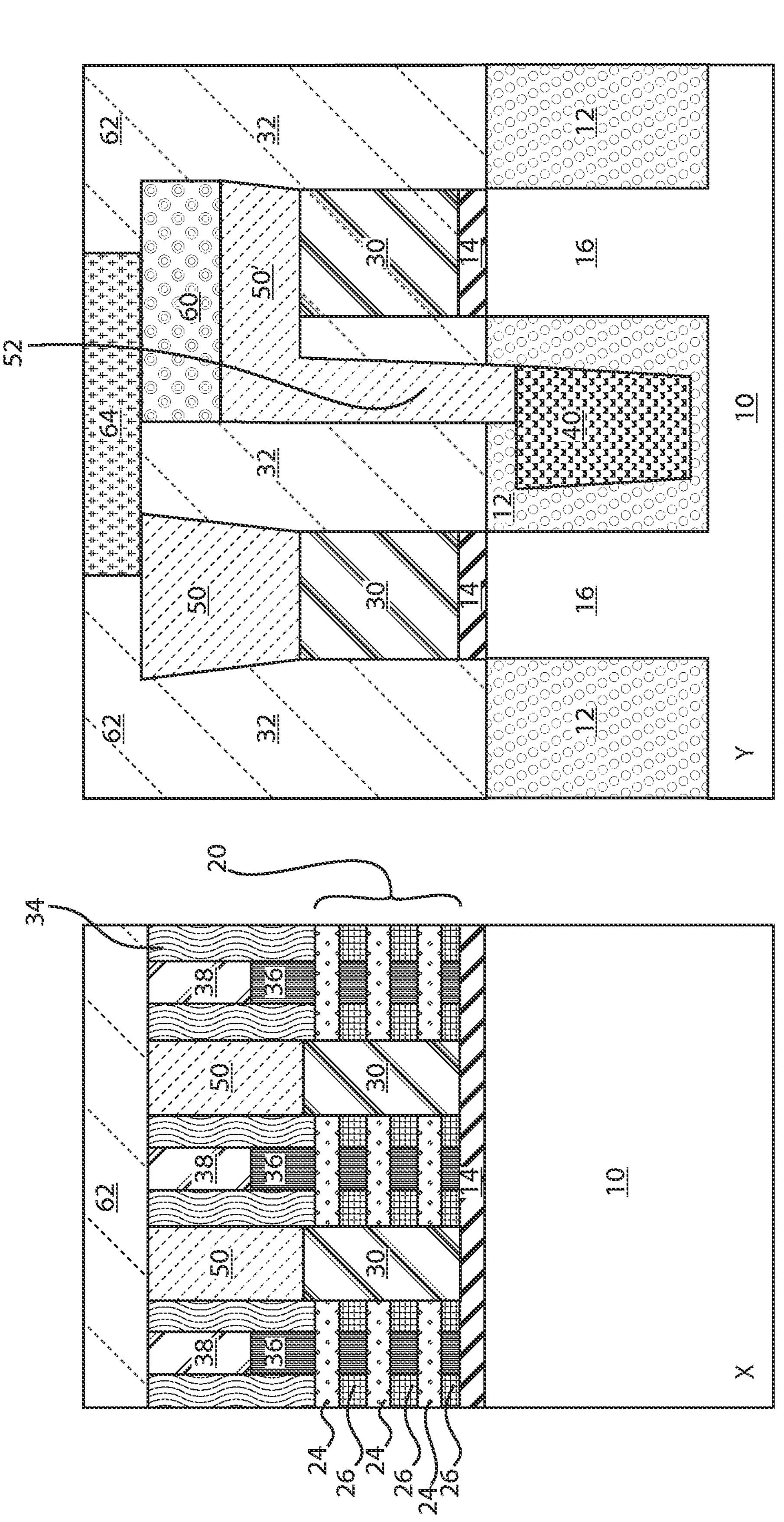
FIG. 9 is a cross-sectional view of the semiconductor structure of FIG. 8 where an interlayer dielectric (ILD) and a local interconnect are deposited, in accordance with an embodiment of the present invention.

FIG. 9 is a cross-sectional view of the semiconductor structure of FIG. 8 where an interlayer dielectric (ILD) and a local interconnect are deposited, in accordance with an embodiment of the present invention.

In various example embodiments, the ILD 62 and the local interconnect 64 are formed. The ILD 62 can be deposited by, e.g., CVD or PVD. The local interconnect 64 is wired to BEOL.

Figure 10:
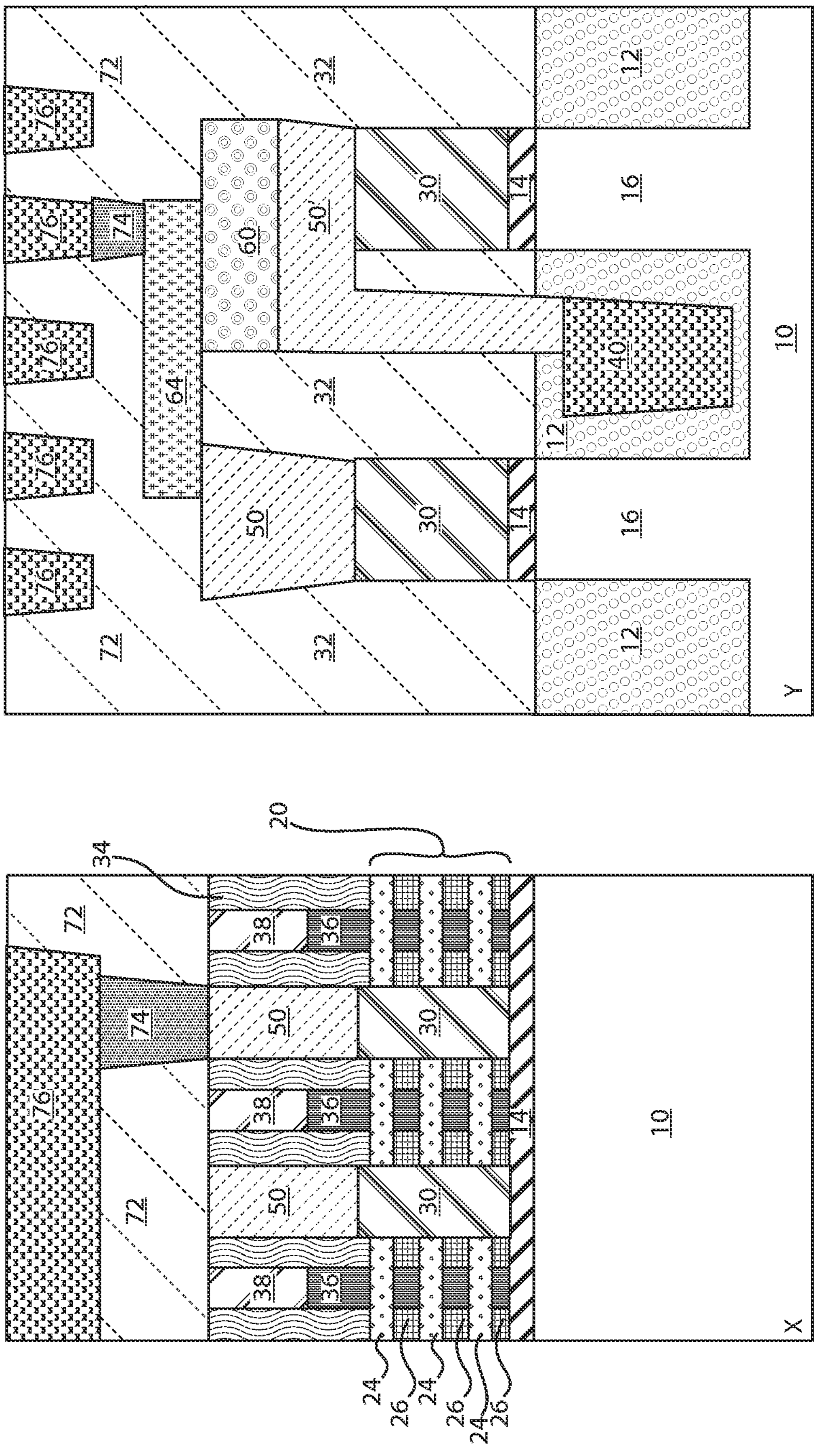
FIG. 10 is a cross-sectional view of the semiconductor structure of FIG. 9 where BEOL vias and a metal line layer are formed, in accordance with an embodiment of the present invention.

FIG. 10 is a cross-sectional view of the semiconductor structure of FIG. 9 where BEOL vias and a metal line layer are formed, in accordance with an embodiment of the present invention.

In various example embodiments, vias and a metal line (M1) layer are formed.

In the X direction, the ILD 72 is deposited and the via 74 is formed over and in direct contact with the CA contact 50. The M1 layer 76 is formed over and in direct contact with the via 74.

In the Y direction, the via 74 is formed over and in direct contact with the local interconnect 64. M1 layer 76 is formed over and in direct contact with the via 74. The via 74 is vertically aligned with the dielectric cap 60. A first end of the local interconnect 64 rests on the un-recessed CA contact 50 associated with a first source/drain epitaxial region and a second end of the local interconnect 64 rests on a dielectric cap over recessed CA/VBPR region associated with a second source/drain epitaxial region.

FIG. 11 is a cross-sectional view of a semiconductor structure including a backside power rail and a backside power distribution network, in accordance with another embodiment of the present invention.

It is noted that the exemplary embodiments not only work for a buried power rail, but also work with a backside power rail with a backside power distribution network.

Thus, in some embodiments, the buried power rail is not used, and instead, a backside power rail 110 is employed with a backside power distribution network (BSPDN) 102.

After MOL processing with recessed CA/VBPR, dielectric CA cap formation, and local interconnect formation, BEOL interconnects (VA/VB, M1, and more BEOL layers 120) are formed, followed by carrier wafer bonding 130.

After that, the wafer can be flipped, and the substrate is then removed to reveal the VBPR contact and FEOL device. After backside ILD deposition 104, the backside power rail 110 and the BSPDN 102 are formed using conventional patterning and metallization techniques. The BSPDN 102 is disposed adjacent the backside power rail 110.

Similar to FIG. 10, with the recessed CA/VBPR, dielectric cap and local interconnect, the exemplary methods can successfully wire a S/D region (which does not go to backside power rail and BSPDN) to M1 lines at a different cell over a recessed S/D region, which is connected to the backside power rail 110 and BSPDN 102 through the VBPR contact 52. Therefore, a source/drain epitaxial region of the source/drain epitaxial regions 30 is wired to an M1 layer 76 at a different cell over a recessed source/drain epitaxial region connected to the buried power rail or backside power rail 110 through the VBPR contact 52.

In summary, the exemplary embodiments of the present invention disclose a method and device of advantageously wiring S/D contacts from one cell to another cell through local interconnects over recessed S/D contacts that wire or connect to a buried power rail or backside power rail to achieve pin access at cell boundary or across cell boundary. In other words, local interconnects are formed over recessed contacts that wire to the buried power rail or the backside power rail. The exemplary device includes at least a first S/D contact with a higher surface, at least another S/D contact with a dielectric cap, and a local interconnect attaching to the higher surface that also partially lands on the dielectric cap. The method includes forming a S/D contact with at least one contact connecting to buried power rail or backside power rail, recessing the contact, forming a contact dielectric cap, forming a local interconnect which has one side landing over the contact dielectric cap and the other side connecting to another S/D contact, and wiring the local interconnect to the BEOL.

Regarding FIGS. 1-11, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a cross cell local interconnect with buried power rail or backside power rail (BPR) and gate contact (CB) over an active region (CBoA) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:

source/drain epitaxial regions disposed over a substrate;

source/drain contacts (CA contacts) disposed in direct contact with the source/drain epitaxial regions, wherein at least one of the CA contacts directly connects to a buried power rail through a via-to-BPR (VBPR) contact;

a dielectric cap disposed over one or more of the CA contacts; and a local interconnect constructed in direct contact with one area of the dielectric cap such that a portion of the local interconnect is vertically aligned with the buried power rail, the local interconnect having a dimension that overlaps two of the CA contacts, wherein a first end of the local interconnect directly contacts one of the two overlapped CA contacts, and wherein a second end of the local interconnect rests on a recessed portion of a CA contact associated with a source/drain epitaxial region of the source/drain epitaxial regions.

2. The semiconductor device of claim 1, wherein a via is disposed in direct contact with the local interconnect.

3. The semiconductor device of claim 2, wherein a metal line (M1) layer is disposed over and in direct contact with the via.

4. The semiconductor device of claim 1, wherein the local interconnect is wired to back end of line (BEOL).

5. The semiconductor device of claim 1, wherein the source/drain epitaxial region is a second source/drain epitaxial region, and wherein the first end of the local interconnect directly contacts an un-recessed portion of the one of the two overlapped CA contacts associated with a first source/drain epitaxial region of the source/drain epitaxial regions.

6. The semiconductor device of claim 1, wherein the VBPR contact has a generally inverted L-shaped configuration.

7. The semiconductor device of claim 1, wherein a gate contact (CB) is disposed in direct contact with a sidewall of the dielectric cap.

8. The semiconductor device of claim 1, wherein the source/drain epitaxial region is a second source/drain epitaxial region, and wherein a first source/drain epitaxial region of the source/drain epitaxial regions is wired to a metal line (M1) layer at a different cell over the second source/drain epitaxial region connected to the buried power rail through the VBPR contact.

9. A semiconductor device comprising:

source/drain epitaxial regions disposed over a substrate;

source/drain contacts (CA contacts) disposed in direct contact with the source/drain epitaxial regions, wherein at least one of the CA contacts directly connects to a backside power rail through a via-to-BPR (VBPR) contact;

a dielectric cap disposed over one or more of the CA contacts;

a local interconnect constructed in direct contact with one area of the dielectric cap such that a portion of the local interconnect is vertically aligned with the backside power rail, the local interconnect having a dimension that overlaps two of the CA contacts, wherein a first end of the local interconnect directly contacts one of the two overlapped CA contacts, and wherein a second end of the local interconnect rests on a recessed portion of a CA contact associated with a source/drain epitaxial region of the source/drain epitaxial regions; and a backside power distribution network (BSPDN) disposed adjacent the backside power rail.

10. The semiconductor device of claim 9, wherein a via is disposed in direct contact with the local interconnect.

11. The semiconductor device of claim 10, wherein a metal line (M1) layer is disposed over and in direct contact with the via.

12. The semiconductor device of claim 9, wherein the local interconnect is wired to back end of line (BEOL).

13. The semiconductor device of claim 9, wherein the source/drain epitaxial region is a second source/drain epitaxial region, and wherein the first end of the local interconnect directly contacts an un-recessed portion of the one of the two overlapped CA contacts associated with a first source/drain epitaxial region of the source/drain epitaxial regions.

14. The semiconductor device of claim 9, wherein the VBPR contact has a generally inverted L-shaped configuration.

15. The semiconductor device of claim 9, wherein the source/drain epitaxial region is a second source/drain epitaxial region, and wherein a first source/drain epitaxial region of the source/drain epitaxial regions is wired to a metal line (M1) layer at a different cell over the second source/drain epitaxial region connected to the backside power rail and the BSPDN through the VBPR contact.

16. A semiconductor device comprising:

source/drain epitaxial regions disposed over a substrate;

source/drain contacts (CA contacts) disposed in direct contact with the source/drain epitaxial regions, wherein at least one of the CA contacts directly connects to a buried power rail through a via-to-BPR (VBPR) contact;

a dielectric cap disposed over one or more of the CA contacts; and a local interconnect constructed in direct contact with one area of the dielectric cap such that a portion of the local interconnect is vertically aligned with the buried power rail, wherein a first end of the local interconnect rests on an un-recessed portion of a CA contact associated with a first source/drain epitaxial region of the source/drain epitaxial regions and a second end of the local interconnect rests on a recessed portion of a CA contact associated with a second source/drain epitaxial region of the source/drain epitaxial regions.

17. The semiconductor device of claim 16, wherein a via is disposed in direct contact with the local interconnect.

18. The semiconductor device of claim 16, wherein the local interconnect is wired to back end of line (BEOL).

19. The semiconductor device of claim 16, wherein the buried power rail is disposed on a backside of the semiconductor device and further comprising a backside power distribution network (BSPDN) disposed adjacent the buried power rail.

20. The semiconductor device of claim 16, wherein a gate contact (CB) is disposed in direct contact with a sidewall of the dielectric cap.

* * * * *